United States Patent
Rountos et al.

[19]

[11] Patent Number: 5,850,142
[45] Date of Patent: Dec. 15, 1998

[54] CONTROL DEVICE HAVING A MAGNETIC COMPONENT WITH CONVEX SURFACES

[75] Inventors: Chris P. Rountos, Trumbull; Richard M. Passaro, Fairfield, both of Conn.

[73] Assignee: Measurement Systems, Inc., Fairfield, Conn.

[21] Appl. No.: 832,269

[22] Filed: Apr. 3, 1997

[51] Int. Cl.[6] .............................. G01B 7/14; G06K 11/18
[52] U.S. Cl. ................................... 324/207.2; 358/32 H; 200/6 A; 324/207.26; 74/471 XY
[58] Field of Search ................ 324/207.21, 207.2, 324/207.25, 251, 260, 207.22, 207.23, 207.26; 338/32 H, 128; 200/6 A; 74/471 XY

[56] References Cited

U.S. PATENT DOCUMENTS

| | | | |
|---|---|---|---|
| 3,331,972 | 7/1967 | Möller | 338/32 H |
| 4,325,050 | 4/1982 | Suszynski | 338/128 |
| 4,459,578 | 7/1984 | Sava et al. | 338/128 |
| 4,489,303 | 12/1984 | Martin | 338/128 |
| 4,490,710 | 12/1984 | Kopsho, Jr. et al. | 338/128 |
| 4,520,242 | 5/1985 | Kopsho, Jr. | 200/6 A |
| 4,584,577 | 4/1986 | Temple | 340/870.32 |
| 4,661,773 | 4/1987 | Kawakita et al. | 324/247 |
| 4,825,157 | 4/1989 | Mikan | 324/251 |
| 4,853,630 | 8/1989 | Houston | 324/207.13 |
| 5,160,918 | 11/1992 | Saposnik | 324/207.22 |
| 5,266,917 | 11/1993 | Bleeke et al. | 338/32 H |
| 5,399,967 | 3/1995 | Carscadden | 324/207.2 |
| 5,421,694 | 6/1995 | Baker et al. | 200/6 A |

FOREIGN PATENT DOCUMENTS

| | | |
|---|---|---|
| 0 501 906 A1 | 9/1992 | European Pat. Off. . |
| 195 03 615 A1 | 8/1995 | Germany . |
| 58-66381 | 4/1983 | Japan . |

OTHER PUBLICATIONS

Allegro MicroSystems, Inc. Preliminary Data Sheet entitled Ratiometric, Linear hall–Effect Sensors for High–Temperature Operation (1996).

*Primary Examiner*—Jay M. Patidar
*Attorney, Agent, or Firm*—Gregory S. Rosenblatt; Wiggin & Dana

[57] ABSTRACT

An angle measurement device capable of providing both linear and non-linear control transfer functions directly using a shaped, generally convex, magnet and linear magnetic sensors, such as Hall sensors. The shape of the magnet is also used to control and optimize the magnitude of the angle measured. This technique of using a special shaped magnet is also used with digital sensors, such as digital Hall switches and arrays.

This angle measurement device can be used in many applications requiring an accurate, robust, reliable (including redundant) but inexpensive method to translate angle displacement into a signal voltage or current. Industrial or military hand controllers, such as joysticks, are but one implementation.

27 Claims, 9 Drawing Sheets

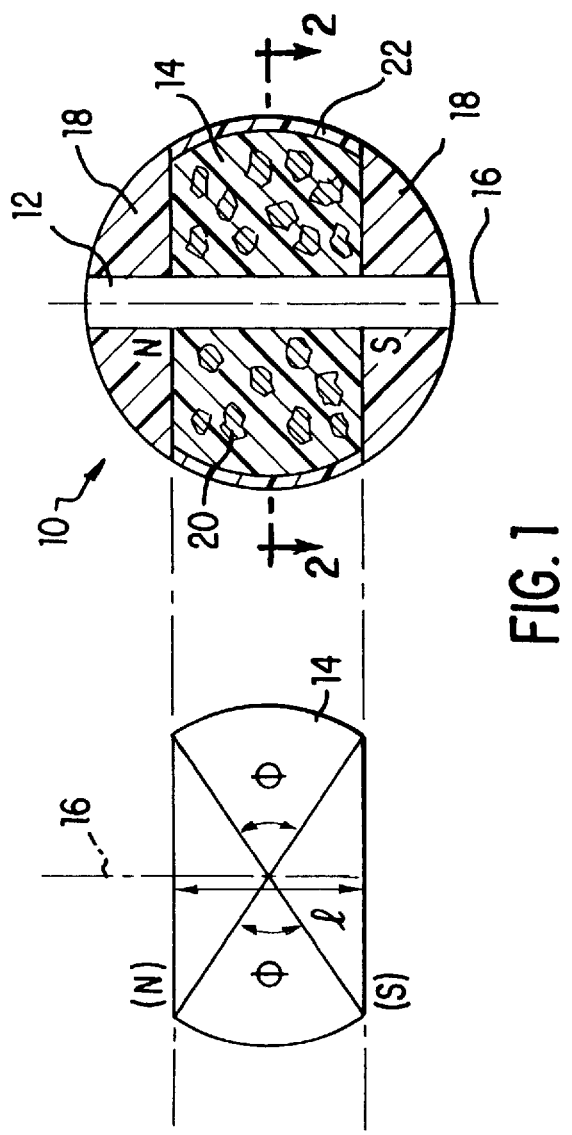
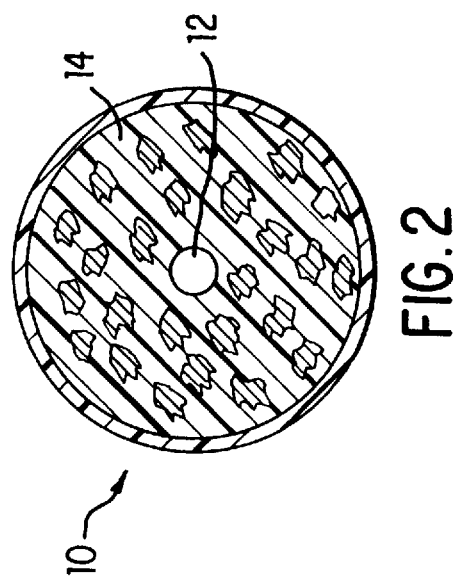

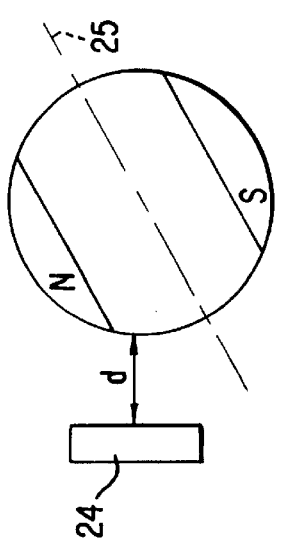
FIG.3-A
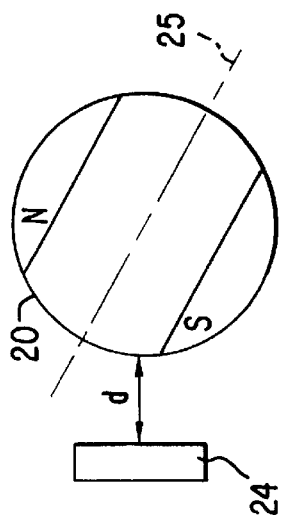
FIG.3-B
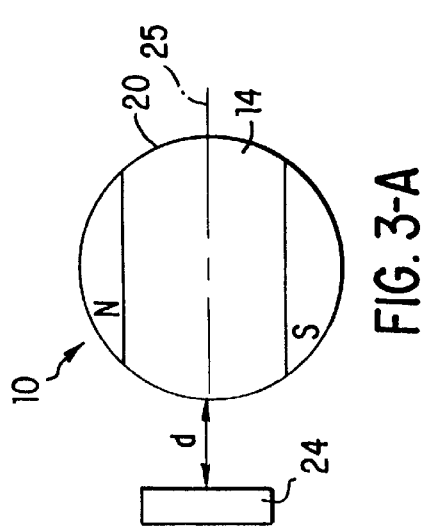
FIG.3-C
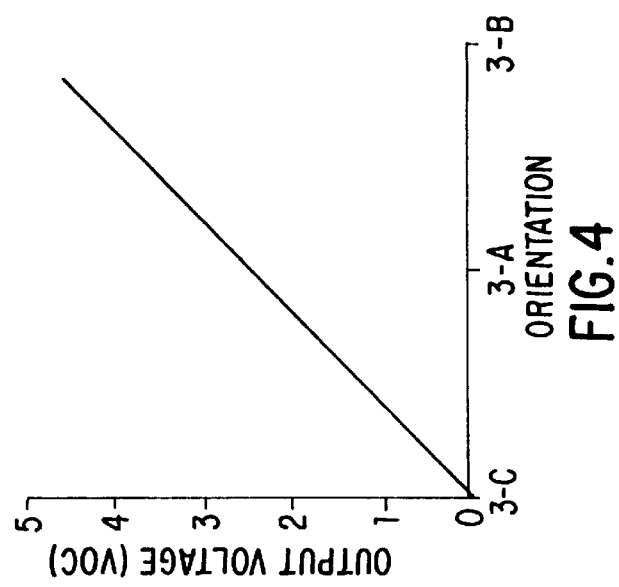
FIG.4

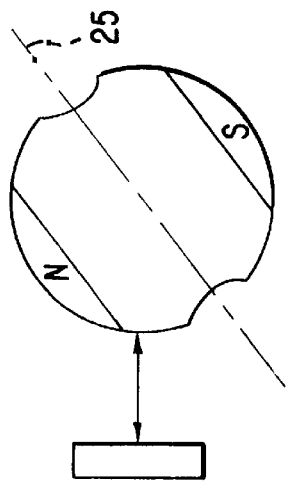
FIG.5-C
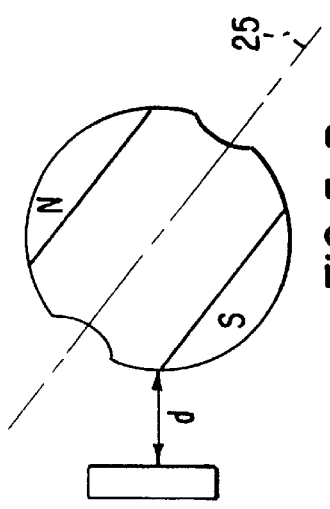
FIG.5-B
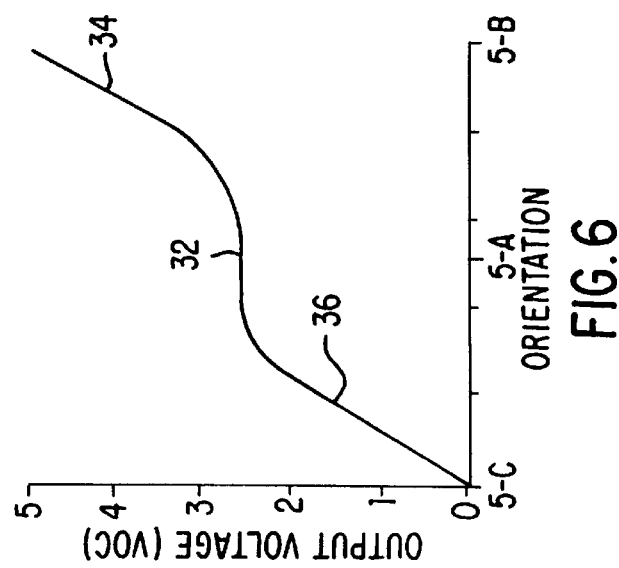
FIG.6
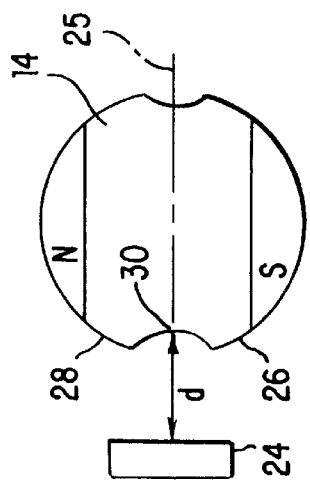
FIG.5-A

CONTROL DEVICE HAVING A MAGNETIC COMPONENT WITH CONVEX SURFACES

BACKGROUND OF THE INVENTION

1. Field of the Invention

This invention relates to magnetically actuated control devices. More particularly, a shaped magnetic field interacts with magnetic sensors to provide a desired transfer function.

2. Description of Related Art

Manual control devices, commonly referred to as joysticks, are used in various apparatus such as video games, heavy construction equipment and aircraft to control parameters such as position, velocity and acceleration. Typically, the joystick has an extended length shaft with a handle at one end and a shaped component at the opposing end that interacts with one or more sensors. Movement of the handle is translated by the sensors into electrical signals that are communicated to the apparatus actuating a desired response.

In one type of joystick, movement of the handle displaces one or more electric potentiometers changing the voltage output. While the potentiometers provide accurately defined signals to the apparatus, the joystick shaft is mechanically coupled to the potentiometers through linkages and gearing. The connection deteriorates over time due to potentiometer and linkage wear. This type of joystick has a large number of moving parts and is subject to premature failure in robust operating environments.

A different type of joystick is disclosed in U.S. Pat. No. 3,331,972 by Möller, that is incorporated by reference in its entirety herein. The Möller patent discloses a joystick having an extended length shaft with a handle at one end and a joint ball at the other end. The joint ball has an embedded magnet that is surrounded by bands of a ferromagnetic material. Movement of the joystick handle completes a magnetic circuit. A number of Hall effect sensors, semiconductor devices that generate a voltage when engaged by a magnetic flux, circumscribe the magnet. Movement of the joystick handle changes the magnetic flux lines, generating a voltage in the Hall effect sensors.

This Hall effect joystick is more robust than a potentiometer-type joystick. The joint ball does not mechanically engage the sensors reducing the risk of mechanical degradation. However, due to inclusion of ferromagnetic components, hysteresis degradation is a problem. As the ferromagnetic components become slightly magnetized, the resulting magnetic field affects the sensors, changing the characteristics of the joystick.

There remains a need for a joystick that is more robust than a potentiometer-type joystick, does not suffer from hysteresis induced performance degradation, cross coupling and output discontinuities and also contains a minimum number of components to provide high reliability in harsh environments.

SUMMARY OF THE INVENTION

Accordingly, it is an object of the invention to provide a highly reliable joystick that does not suffer the disadvantages of the prior art. It is a feature of the invention that the joystick includes a component having a magnetic portion with a desired shape and symmetry about a control shaft. A number of magnetic sensors, such as Hall effect sensors, are disposed about the magnetic portion and movement of the control shaft changes the magnetic flux lines, generating a desired transfer function.

Among the advantages of the invention are high reliability. There are no moving parts except the specially shaped magnet and the joystick shaft. There is no restriction on magnet resulting in a simple design with a limited number of parts to high reliability and low cost. Since fragile potentiometers are not required, the joystick is ideally suited for operation in extreme temperatures and harsh environments, as typically encountered in heavy construction equipment and military environments.

Further advantages include excellent signal linearity, low hysteresis, temperature stability and reduced cross talk as compared to AlNiCo magnets. Additionally, the control device of the invention is particularly suited to applications requiring multiple redundancy for increased reliability, such as aircraft controls.

In accordance with the invention, there is provided a control device. The control device has a magnetic portion with symmetry about an axially disposed hole. The magnetic portion has a shape effective to provide a desired function and is constructed to be effective to minimize magnetic flux distortion, cross talk and hysteresis. A non-magnetic shaft extends into the hole and at least one non-magnetic bushing supports the component. One or more magnetic sensors are then disposed about the magnet.

The above stated objects, features and advantages will become more apparent from the specification and drawings that follow.

BRIEF DESCRIPTION OF THE DRAWINGS

FIG. 1 illustrates in cross-sectional representation of a component in accordance with the invention.

FIG. 1-A schematically illustrates the rotational capability of the component of FIG. 1.

FIG. 2 illustrates another cross-sectional representation of the component of the invention.

FIGS. 3A–3C illustrate the constant air gap achieved with a curvilinear-shaped magnetic portion having convex walls in accordance with an embodiment of the invention.

FIG. 4 graphically illustrates the linear electric signal achieved with the curvilinear-shaped magnetic portion of FIGS. 3A–3C.

FIGS. 5A–5C illustrate a magnetic portion having curved sidewalls with a concave equatorial portion in accordance with another embodiment of the invention.

FIG. 6 graphically illustrates the electrical signal achieved with the magnetic portion of FIGS. 5A–5C.

DETAILED DESCRIPTION

Figure 7:
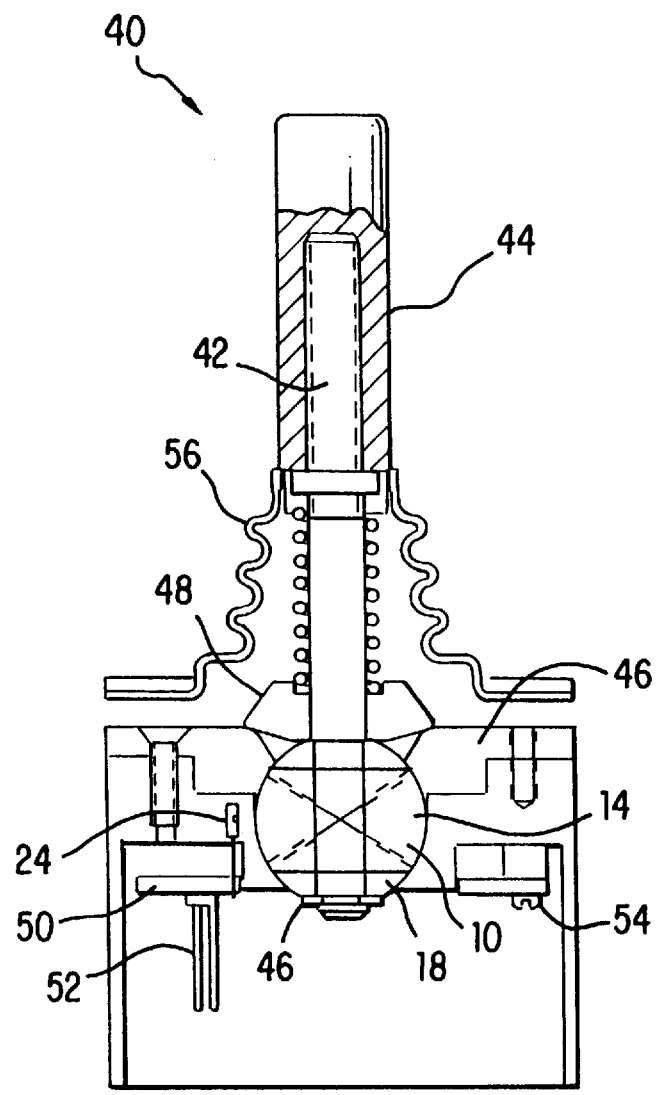
FIG. 7 illustrates in cross-sectional representation one type of joystick manufactured with the shaped magnetic portion of the invention.

A solid, curvilinear-shaped component 10 in accordance with an embodiment of the invention is illustrated in cross-sectional representation in FIGS. 1 and 2. The component 10 is generally symmetric about an axially disposed hole 12 that extends from the magnetic poles (N,S). The axially disposed hole 12 is adapted to receive a joystick shaft (not shown). The axially disposed hole 12 may be a through hole, as illustrated in FIG. 1, or may terminate within the component 10.

The component 10 has a continuous magnetic portion 14 that, with the exception of the axially disposed through hole, is not interrupted by air gaps or other magnetic flux distorting materials. To minimize cross-talk, the magnetic portion 14 is preferably an integral, hybrid-type, magnet having a uniform mixture of magnetic powders dispersed in a polymer matrix. Exemplary are a mixture of a rare earth component and a ferritic component dispersed in a polymer matrix, such as a mixture of neodymium powder and ferrite powder dispersed in a nylon binder. Alternatively, the ferritic component may be omitted in favor of neodymium powder alone. Such a magnet is available, as Arnold #2403 magnet material, from the Arnold Engineering Company of Marengo, Ill.

Less preferred are the sintered, all metal, magnets such as AlNiCo. The all metal magnets were found by the inventors to increase the amount of cross talk.

The magnetic portion 14 is magnetized by conventional means, typically by interaction with a high strength, highly directionalized, magnetic field. The magnetic north and south poles are aligned along a longitudinal axis 16 centering the axially disposed hole 12. The magnetic portion 14 has a magnetic flux density in the range of from about 2500 gauss to about 6000 gauss, and preferably on the order of about 3500 gauss to about 4500 gauss.

To reduce wear and decrease friction, low coefficient of friction arc portions 18 are mounted to the flat surfaces of the magnetic portion 14. Preferably, the arc portions 18 have a radius of curvature matching the radius of curvature of the outside walls 20 of the component 10. Typically, the arc portions 18 are formed from a low coefficient friction polymer such as nylon or "TEFLON" (trademark of DuPont, Wilmington, Del. for polytetraflurorethylene).

To further reduce friction, the magnetic portion 14 of the component 10 may be coated with a thin, on the order of 0.001 inch to 0.005 inch, layer 22 of a low coefficient of friction polymer such as nylon or Teflon.

The magnetic portion 14 is shaped to provide a desired transfer function and is constructed to be effective to minimize magnetic flux distortion. Magnetic flux distortion occurs when a foreign material intersects and distorts the magnetic flux lines, or when the air gap distance varies. As such, ferromagnetic materials are preferably avoided.

The curvature of the outer wall 20 of the magnetic portion 14 and the distance between the north and south poles determine the transfer function. Referring to FIG. 1-A, the magnetic portion 14 has a length, l, measured between opposing planar polar portions along longitudinal axis 16 effective to provide a desired angle of rotation, $\phi$. Providing a joystick with the required angle, $\phi$, by the manner of the invention is much simpler and more reliable than mechanical control through gearing or other means.

With reference to FIGS. 3-A through 3-C, one preferred curvature is a convex arc terminating at the opposing planar portions. As shown in FIG. 3-A, a magnetic sensor 24, such as a Hall effect sensor, is located a desired distance, "d", from the outside wall 20 of the magnetic portion 14 of the magnetic point ball 10. The distance "d" is referred to as the "air gap" and represents the thickness of non-magnetic material between the outside wall 20 and the magnetic sensor 24. If the magnet 10 is coated with a low friction layer, as described above, the thickness of that low friction layer constitutes a portion of the air gap. It is within the scope of the invention for the entire air gap to be occupied by a low friction layer.

Typically, the air gap is from about 0.05 inch to about 0.25 inch and preferably the air gap is from about 0.1 inch to about 0.2 inch. For a 4000 gauss magnet, a 0.15 inch air gap results in a magnetic flux density of about 400 gauss intersecting the magnetic sensor 24. Changing the air gap changes the sensitivity of the output of the control.

If the magnetic sensor is operating at 5 volts direct current (DC), when the magnetic portion 14 is aligned as illustrated in FIG. 3-A, with an equatorial axis 25 aligned with the magnetic sensor 24, the flux density at the magnetic sensor 24 is effectively 0. The output from the magnetic sensor 24 is biased to one half the supplied voltage; +2.5 volts DC at zero gauss.

As the south pole (S) approaches the magnetic sensor 24, as illustrated in FIG. 3-B, the output voltage approaches +5 volts DC. The air gap "d" remains constant due to the convex curvature of the outer wall 20. When the magnet 10 is rotated in the opposite direction, and the north pole (N) of the magnet approaches the magnetic sensor 24, as illustrated in FIG. 3-C, the output approaches 0 volts.

Since the air gap "d" remains constant as the component 10 is rotated, the sensitivity remains constant during rotation and a linear transfer function, as graphically illustrated in FIG. 4, is achieved. FIG. 4 shows a linear transfer function of from 0 to 5 volts as the component is rotated from the position illustrated in FIG. 3-C through the position of FIG. 3-A to the position of FIG. 3-B. Since the output voltage is readily determined, high accuracy can be achieved with a magnetic portion 14 having convexly curved outer walls.

Other outer wall curvatures are used to achieved different desired transfer functions. In an embodiment illustrated in FIGS. 5-A through 5-C, the outer wall 20 has a first convex portion 26 adjacent to the south pole and a second convex portion 28 adjacent to the north pole. Disposed between the first 26 and second 28 convex portions is a concave portion 30. The air gap, d', is greater when the magnetic portion is equatorialy oriented as in FIG. 5-A than when the component is oriented as in FIGS. 5-B or 5-C. This results in a decrease in sensitivity when the equatorial axis 25 of the component 10 is aligned with the magnetic sensor 24 and provides a transfer function as illustrated in FIG. 6.

As graphically illustrated in FIG. 6, there is a low sensitivity portion 32 corresponding to equatorial alignment as illustrated in 5-A where a relatively large rotation of the component produces only a minimal increase in voltage. This portion of the transfer function voltage curve is particularly suited for applications requiring high precision positioning or tracking. Movements of the joystick to produce rotation around the equator (FIG. 5-A) result in only very slight changes in voltage, allowing for very accurate placement of the device. Movements near the north and south pole of the magnetic portion, as illustrated by transfer function voltage curve portions 34 and 36, produce relatively large voltage changes, allowing for rapid, but less accurate changes in the positioning of the device.

FIG. 7 illustrates a control device 40 incorporating the component 10 of the invention. A non-magnetic shaft 42 extends from the component 10 to a handle 44. The non-magnetic shaft 42 is any strong, non-magnetic, material that resists deflection and bending in use. Particularly preferred are non-magnetic stainless steels.

A non-magnetic bushing 46 contacts the arc portion 18 of the component 10. To reduce friction, the non-magnetic bushing 46 is formed from a polymer such as nylon, "DELRIN" (trademark of DuPont for acetal homopolymer) or Teflon. Movement of the handle 44 rotates the component 10 through approximately ±30° of rotation. A centering spring 48 is effective to return the component 10 to a neutral position with the equator of the magnetic portion 14 aligned with at least one magnetic sensor 24.

Preferably, at least two magnetic sensors 24 are disposed about the circumference of the component, in the same plane, but separated by 90°. More preferably, two additional sensors are disposed in the same plane, again separated by 90° such that the component is surrounded by four sensors, each radially separated from adjacent sensors by 90°. Each set of two adjacent sensors is capable of providing "X" and "Y" axis information concerning movement of the magnetic portion. The four sensors provide dual redundant signals, highly desirable in applications such as aircraft where high reliability is mandatory. For higher redundancies, more sensors may be provided.

Each magnetic sensor 24 is electrically connected to a printed circuit board assembly 50 leading to leads 52 that provide for electrical interconnection of the output to an apparatus to be controlled. Screws 54 hold the printed circuit board 50 in place.

An external boot seal 56, typically formed from neoprene rubber or another flexible elastomer, keeps dirt, oil and other contaminants from the interior of the joystick.

Figure 8:
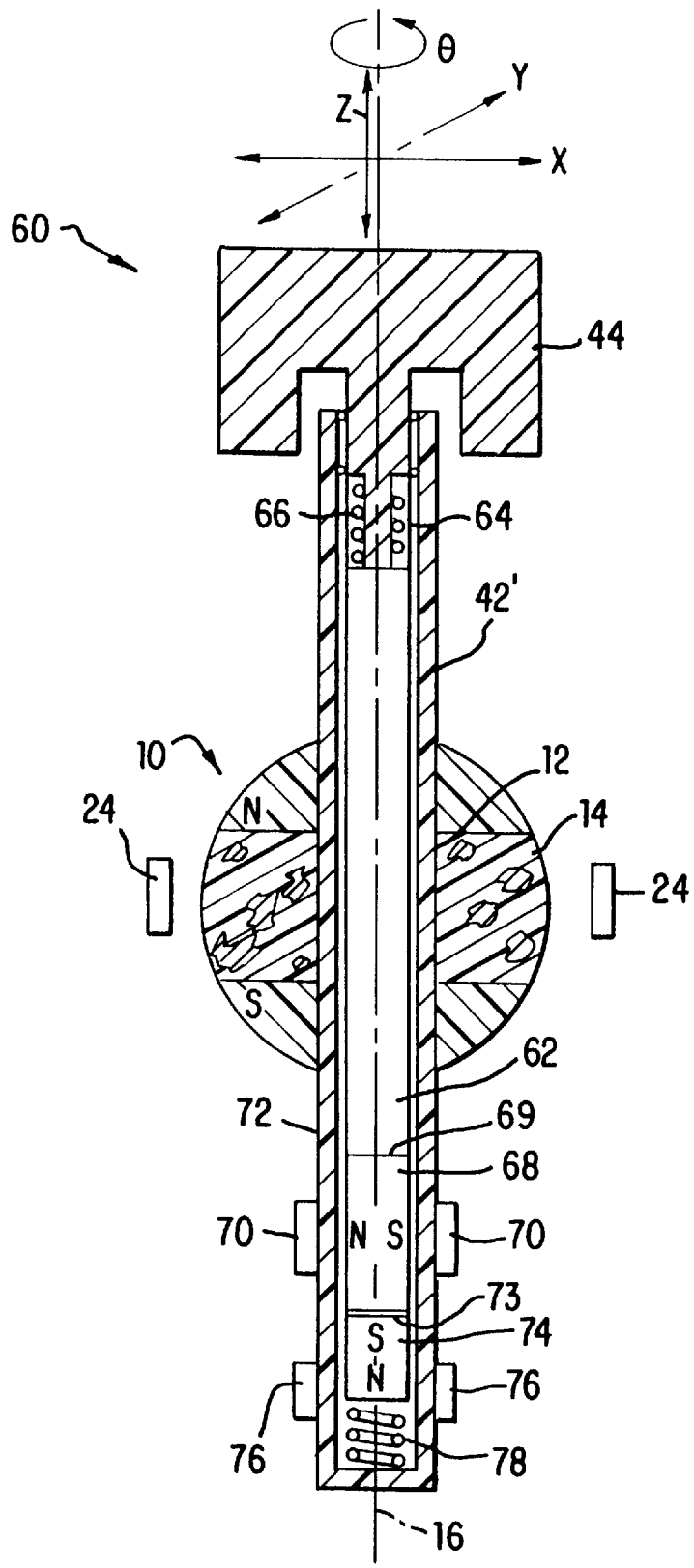
FIG. 8 illustrates in cross-sectional representation a second type of joystick manufactured with the shaped magnetic portion of the invention.
Figure 9:
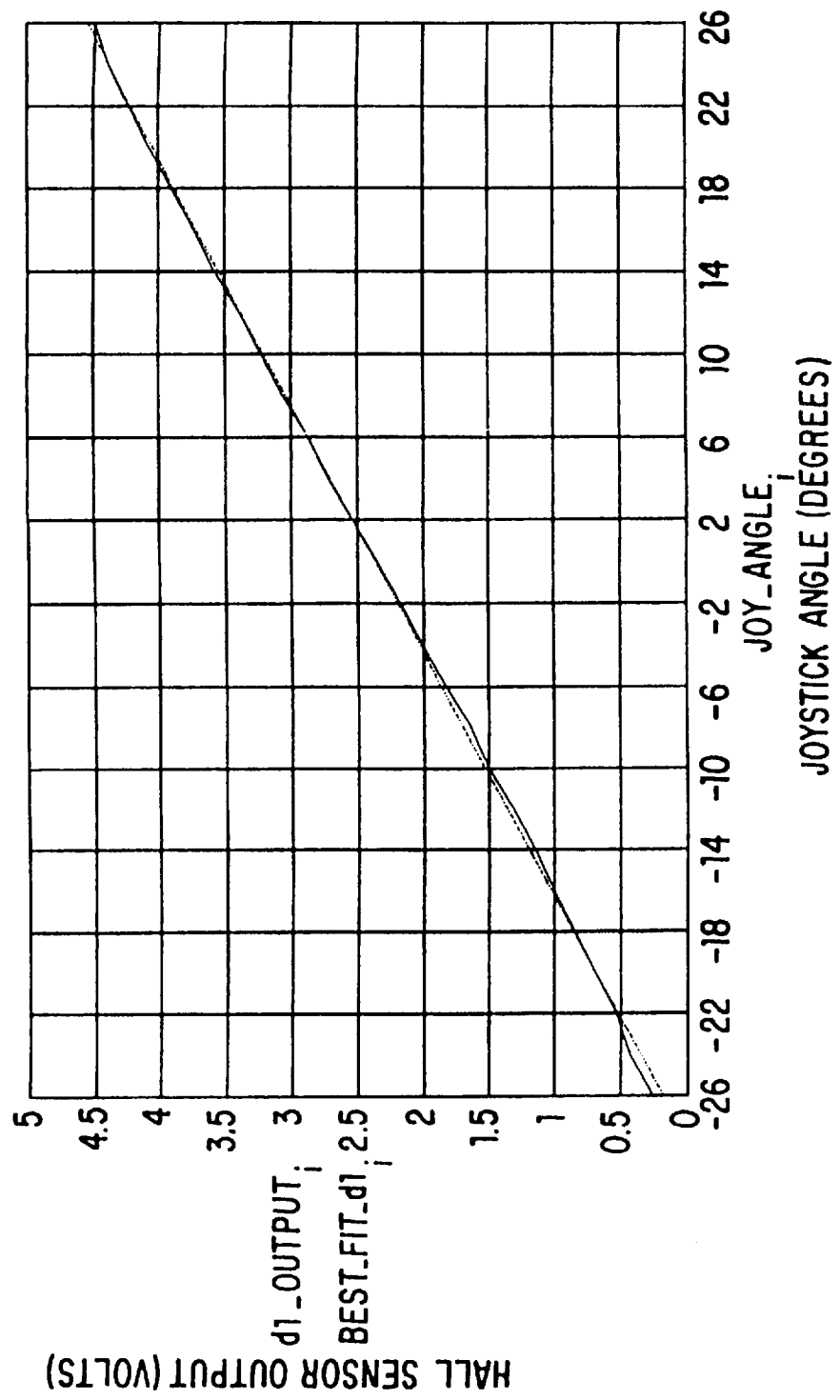
FIGS. 9–12 graphically illustrate the linearity of the transfer function achieved with the shaped magnetic portion illustrated in FIGS. 1 and 2.
Figure 10:
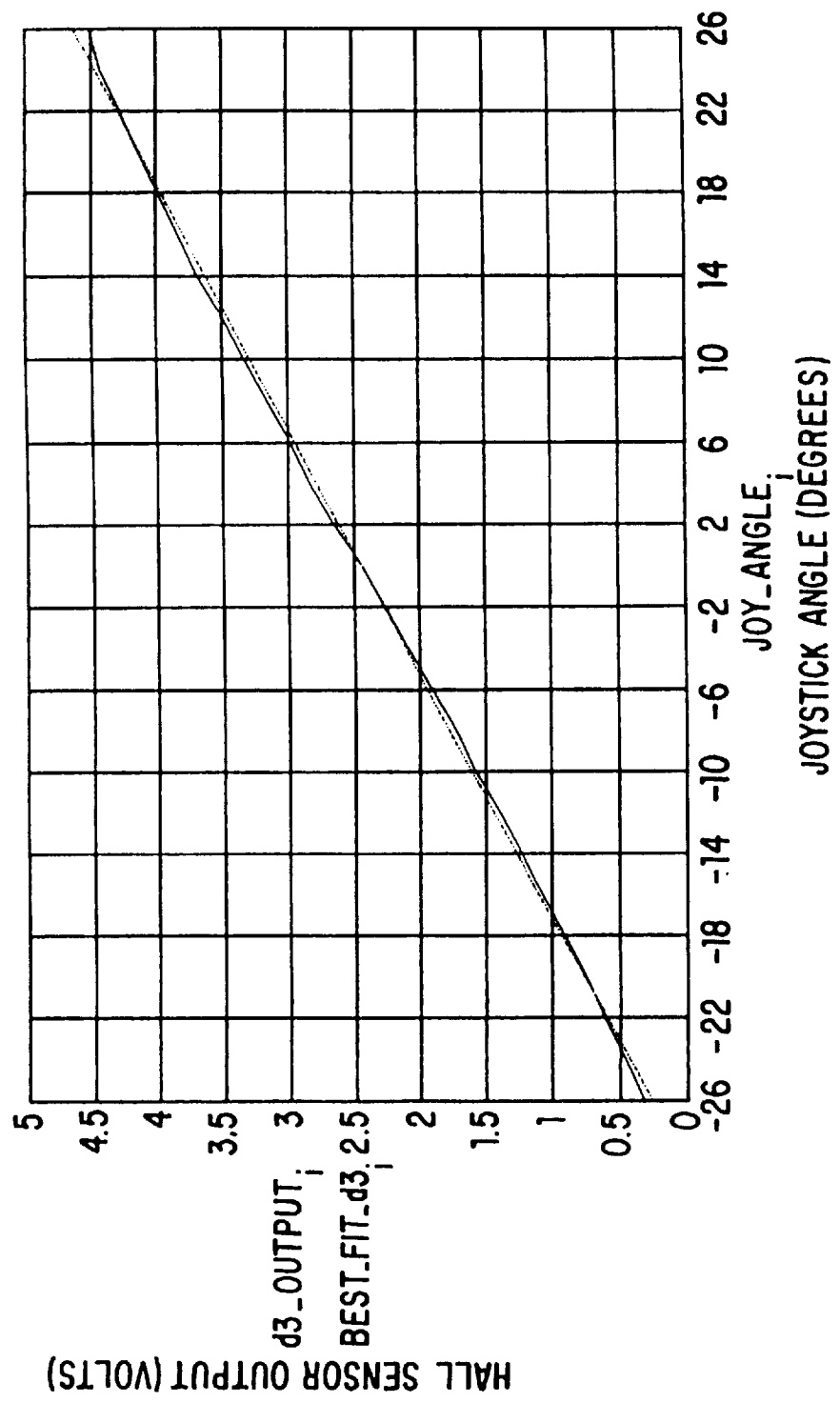
Figure 11:
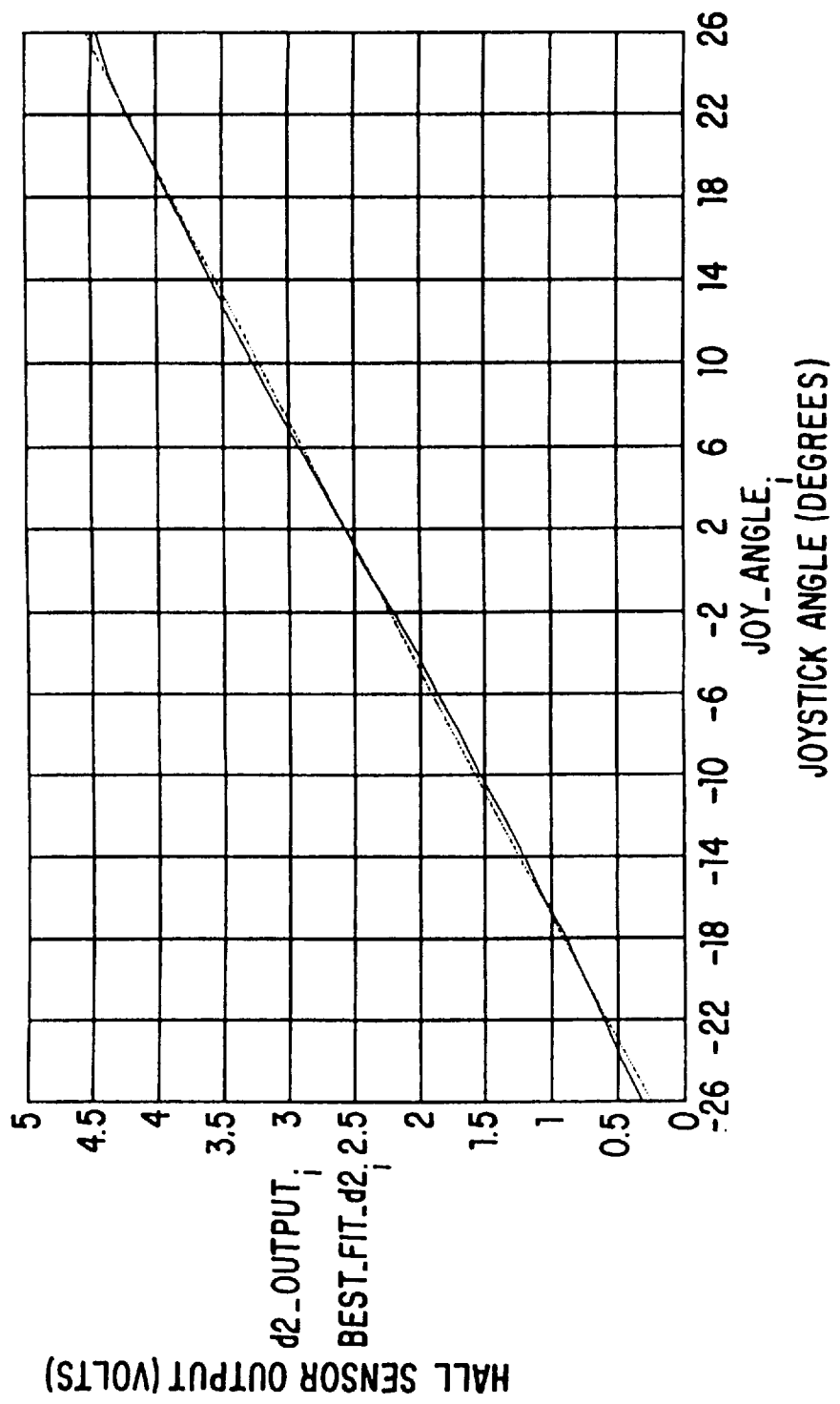
Figure 12:
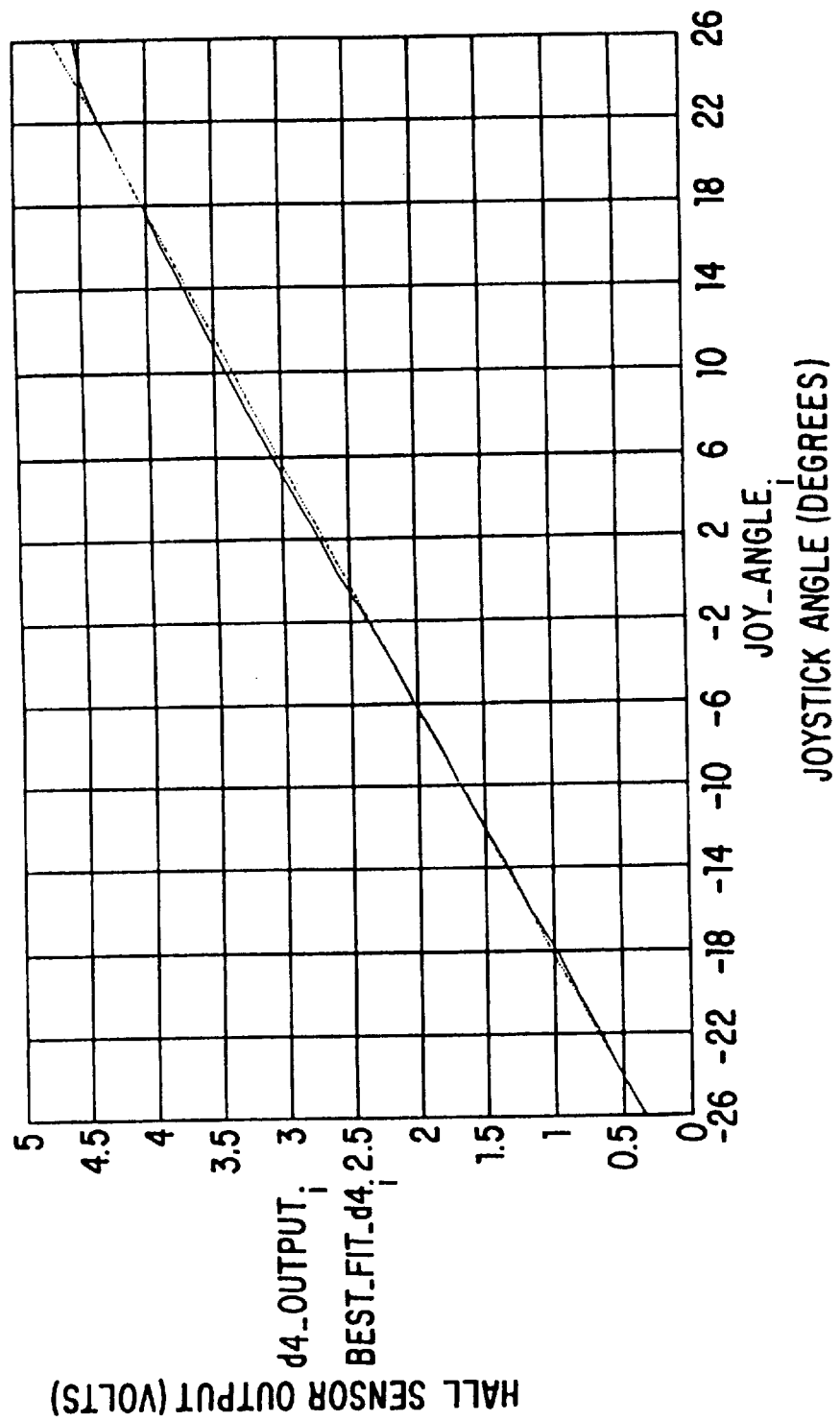

FIG. 8 illustrates in cross sectional representation, a joystick 60 having multiple functions (axes) and redundancies. The joystick 60 includes a handle 44 that engages a hollow shaft 42', that is preferably non-magnetic. Mounted to the hollow shaft 42', with the hollow shaft extending through the hole 12, is the component 10 with a shaped magnetic portion 14 as described above. One or more first Hall sensors 24 are disposed adjacent to the component about the equatorial axis of the shaped magnetic portion 14 and generate an output signal when the hollow shaft 42' is moved in the "X" or "Y" directions.

An internal extension 62, that is preferably non-magnetic, extends within the cavity 64 of the hollow shaft 42'. A first spring 66 is disposed between the handle 44 and a first end of the internal extension 62. At the opposing second end of the internal extension 62 is a first magnet 68 having a first side 69 that is adjacent to the internal extension 62. The first magnet 68 is of generally cylindrical configuration and magnetized such that the north and south poles are radially disposed along the sidewalls of the cylinder. One or more second magnetic sensors 70, such as Hall sensors, are mounted to the outer wall 72 of the hollow shaft 42' opposite the first magnet. To prevent magnetic flux distortion, the first magnet is displaced along the hollow shaft 42' relative to the component 10 and provides a third axis (θ, typically twist or yaw) of motion. Rotation of the hollow shaft 42' generates an output signal in the second Hall sensors 70.

Adjacent to an opposing second side 73 of the first magnet 68 is a second magnet 74 that is displaced along the hollow shaft 42' relative to both the component 10 and the first magnet 69. The second magnet 74 has a north and a south pole aligned along the longitudinal axis 16 running through the cavity 64 of the hollow shaft 42'. One or more magnetic switches 76, such as Hall switches, activated by a change in magnetic flux or polarity, are mounted to the outer wall 72 of the hollow shaft 42' opposite the second magnet 74. Pushing down on the handle 44, generating movement along the "Z" (longitudinal) axis generates a discrete (digital) output signal in the Hall switches 76. A second spring 78 returns the second magnet 74 to an original position when the force depressing handle 44 is removed.

As an alternative, the Hall effect switches are replaced with other Hall sensors, such as linear Hall effect sensors, to provide a fourth, Z-axis, continuous (analog) output signal.

Each of the three sets of sensors (24,70,76) associated with the joystick 60 is independent of the other two sets of sensors. Movement of the handle 44 in the "X" or "Y" direction, changes the orientation of the magnetic portion 14 relative to the first set of Hall sensors 24, creating an output signal in those sensors. Since the second set of Hall sensors 70 and the Hall switches are mounted to the hollow shaft 42', these two sets of sensors do not detect movement of the handle in the "X" and "Y" directions and do not generate an output voltage for this type of movement.

Rotation of the hollow shaft 42' changes the orientation of the first magnet 68 relative to the second Hall sensors 70 creating an output signal in these sensors. Due to the radial symmetry of the component 10 and the second magnet 74, rotation of the hollow shaft 42' does not generate an output signal in either the first Hall sensor 24 or the Hall switch 76.

Depressing the handle 44 engaging downwardly the extension portion 62 moves the second magnet 74 downward changing the polarity sensed by Hall switches 76 causing the switches to generate an output signal. Depression of the handle does not change the orientation of the component 10 relative to the first Hall sensors 24 so no output signal is generated by these sensors. The first magnet 68 has symmetry along the longitudinal axis 16 and longitudinal movement of the first magnet 68 does not change the magnetic flux sensed by the second Hall sensors 70 and depression of the handle 44 does not cause generation of a output signal in this set of sensors.

The joystick 60 is particularly suitable for movement of a bucket associated with heavy equipment. The bucket is positioned by movement of the joystick shaft along the "X" and "Y" direction generating output signals from the first Hall sensors 24. Bucket elevation is controlled by rotation of the handle 44 generating output signals from the second Hall sensors 70. The bucket is opened, to release a load, by depression of the handle 44 generating an output signal from the Hall switch 76.

The advantages of the shaped magnets of the invention will become more apparent from the examples that follow.

EXAMPLES

A control device in accordance with the invention was provided with a magnetic portion having walls with uniformly convex curvature and an equatorial diameter of 1 inch. The joystick was designed for the magnetic portion to move through an arc of ±27°. Four Hall effect sensors were disposed about the equator of the magnetic portion offset by 90°. Two opposing (radially separated by 180°) sensors were designated d1 and d3 and lie along the "X" axis. The other two 180° radially separated sensors (d2 and d4) lie along the "Y" axis.

The output voltage of the Hall effect sensors was set to a maximum of 4.90 volts DC. The joystick was moved to rotate the magnet in 2° intervals over the entire range of motion. The output voltages of the four sensors are recorded in Table 1.

TABLE 1

| Joy-Angle | d2 Output | d4 Output | d1 Output | d3 Output |
|---|---|---|---|---|
| 26 | 4.472 | 4.546 | 4.507 | 4.516 |
| 24 | 4.367 | 4.490 | 4.399 | 4.436 |
| 22 | 4.229 | 4.365 | 4.234 | 4.285 |
| 20 | 4.064 | 4.203 | 4.086 | 4.153 |
| 18 | 3.912 | 4.037 | 3.915 | 3.996 |

TABLE 1-continued

| Joy-Angle | d2 Output | d4 Output | d1 Output | d3 Output |
|---|---|---|---|---|
| 16 | 3.750 | 3.897 | 3.746 | 3.842 |
| 14 | 3.595 | 3.735 | 3.586 | 3.693 |
| 12 | 3.444 | 3.576 | 3.402 | 3.502 |
| 10 | 3.276 | 3.415 | 3.237 | 3.338 |
| 8 | 3.108 | 3.251 | 3.073 | 3.171 |
| 6 | 2.929 | 3.077 | 2.882 | 2.995 |
| 4 | 2.750 | 2.901 | 2.729 | 2.841 |
| 2 | 2.574 | 2.727 | 2.545 | 2.654 |
| 0 | 2.414 | 2.570 | 2.358 | 2.450 |
| −2 | 2.205 | 2.367 | 2.183 | 2.272 |
| −4 | 2.025 | 2.186 | 2.013 | 2.096 |
| −6 | 1.863 | 2.020 | 1.831 | 1.910 |
| −8 | 1.686 | 1.842 | 1.642 | 1.725 |
| −10 | 1.537 | 1.692 | 1.502 | 1.582 |
| −12 | 1.365 | 1.507 | 1.318 | 1.394 |
| −14 | 1.203 | 1.331 | 1.151 | 1.231 |
| −16 | 1.060 | 1.175 | 1.007 | 1.076 |
| −18 | 0.888 | 0.982 | 0.853 | 0.912 |
| −20 | 0.753 | 0.829 | 0.691 | 0.756 |
| −22 | 0.607 | 0.664 | 0.536 | 0.618 |
| −24 | 0.472 | 0.511 | 0.436 | 0.462 |
| −26 | 0.320 | 0.337 | 0.262 | 0.324 |

As graphically illustrated in FIGS. 9–12, each sensor provided essentially a linear output.

While generally described in terms of a component having an axially disposed hole, the component may be spheroidal and lack the hole, for applications such as a track ball.

It is apparent that there has been provided in accordance with the present invention a magnetically actuated control device that fully satisfies the objects, features and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A control device, comprising:
    A component having a magnetic portion, said magnetic portion having uniformly convex sidewalls that terminate at opposing polar portions symmetrically disposed about an axially disposed hole, said magnetic portion further having a shape effective to provide a desired transfer function and a construction effective to minimize magnetic flux distortion, cross talk and hysteresis;
    a shaft extending into said hole;
    at least one non-magnetic bushing supporting said component; and
    at least one magnetic sensor disposed adjacent to said magnetic portion.

2. The control device of claim 1 wherein said magnetic portion is comprised of a uniform mixture of magnetic powders dispersed in a polymeric matrix.

3. The control device of claim 2 wherein said magnetic powders include neodymium.

4. The control device of claim 3 wherein said magnetic portion has walls with first and second convex portions adjacent to respective north and south poles and a concave portion disposed between said first and second convex portions.

5. The control device of claim 2 wherein said opposing polar portions are planar.

6. The control device of claim 5 wherein opposing ones of said planar polar portions are separated by a distance effective to provide said control device with a desired angle of rotation.

7. The control device of claim 6 wherein said magnetic portion is coated with a low coefficient of friction polymer.

8. A control device, comprising:
    A component having a magnetic portion, said magnetic portion having uniformly convex sidewalls that terminate at polar portions symmetrically disposed about an axially disposed hole, said magnetic portion further having a shape effective to provide a desired transfer function and a construction effective to minimize magnetic flux distortion, cross talk and hysteresis;
    a hollow shaft having first and second opposing ends and extending through said hole;
    a handle disposed at said first end of said hollow shaft;
    a first magnet disposed within said hollow shaft in displacement from said component;
    at least one first magnetic sensor disposed adjacent to said magnetic portion; and
    at least one second magnetic sensor mounted to said hollow shaft in apposition to said first magnet.

9. The control device of claim 8 wherein said first magnet is generally shaped as a cylinder and has north and south poles disposed along sidewalls of said cylinder.

10. The control device of claim 9 wherein said first and said second magnetic sensors are Hall effect sensors.

11. The control device of claim 9 wherein a second magnet is disposed within said hollow shaft in displacement relative to both said component and said first magnet and at least one third magnetic sensor is mounted to said shaft in apposition to said second magnet.

12. The control device of claim 11 wherein said second magnet has north and south poles disposed along an axis running parallel to the longitudinal axis of said hollow shaft and said third magnetic sensor is selected from the group consisting of digital Hall effect switches and linear Hall effect sensors.

13. The control device of claim 12 further including an extension portion engaging both said handle and said second magnet whereby vertical displacement of said handle relative to said hollow shaft results in displacement of said second magnet.

14. The control device of claim 13 wherein said magnetic portion of said component is comprised of a uniform mixture of magnetic powders dispersed in a polymeric matrix.

15. The control device of claim 14 wherein said opposing polar portions are planar.

16. The control device of claim 15 wherein opposing ones of said planar polar portions are separated by a distance effective to provide said control device with a desired angle of rotation.

17. The control device of claim 16 wherein said magnetic portion is coated with a low coefficient of friction polymer.

18. The control device of claim 14 wherein said magnetic portion has walls with first and second convex portions adjacent to respective north and south poles and a concave portion disposed between said first and second convex portions.

19. A control device, comprising:
    A magnet in combination with one or more magnetic sensors, said magnet having a shape that is effective to provide an essentially linear relationship with said one or more magnetic sensors between angle position and magnetic flux density and a construction effective to minimize magnetic flux distortion, cross talk and hysteresis, said magnet being formed from a uniform mixture of magnetic powders dispersed in a polymeric matrix wherein said magnet has a shape that is essentially spheroidal with uniformly convex sidewalls that terminate at opposing polar portions.

20. The control device of claim 19 wherein said magnet is coated with a low coefficient of friction polymer.

21. The control device of claim 19 wherein said opposing polar portions are planar.

22. The control device of claim 21 wherein a distance between said opposing polar portions provide said magnet with a desired angle of rotation.

23. The control device of claim 22 having a concave portion disposed between said uniformly convex sidewalls thereby providing said control device with a controlled non-linear relationship between angle position and magnetic flux density.

24. The control device of claim 19 wherein said magnet is coated within a non-magnetic material.

25. The control device of claim 24 wherein said coating has a thickness of up to 0.25 inch.

26. The control device of claim 25 being a track ball.

27. The control device of claim 25 further including an axially disposed hole.

* * * * *

UNITED STATES PATENT AND TRADEMARK OFFICE
CERTIFICATE OF CORRECTION

PATENT NO. : 5,850,142
DATED : December 15, 1998
INVENTOR(S) : Chris P. Rountos, et al.

It is certified that error appears in the above-identified patent and that said Letters Patent is hereby corrected as shown below:

Column 2, lines 30 and 31, delete "invention. FIG. 1-A" and insert -- invention and--.

Column 3, line 46, delete "1-A" and insert "1".

Signed and Sealed this

Sixteenth Day of March, 1999

Attest:

Q. TODD DICKINSON

Attesting Officer    Acting Commissioner of Patents and Trademarks